(12) United States Patent
Peng

(10) Patent No.: US 8,568,150 B1
(45) Date of Patent: Oct. 29, 2013

(54) CENTRAL PROCESSING UNIT SOCKET

(75) Inventor: Wen-Ting Peng, Wuhan (CN)

(73) Assignees: Hong Fu Jin Precision Industry (WuHan) Co., Ltd., Wuhan (CN); Hon Hai Precision Industry Co., Ltd., New Taipei (TW)

( * ) Notice: Subject to any disclaimer, the term of this patent is extended or adjusted under 35 U.S.C. 154(b) by 2 days.

(21) Appl. No.: 13/527,955

(22) Filed: Jun. 20, 2012

(30) Foreign Application Priority Data

May 8, 2012 (CN) .......................... 2012 1 0139793

(51) Int. Cl.
*H01R 13/62* (2006.01)
(52) U.S. Cl.
USPC ............................................................ 439/71
(58) Field of Classification Search
USPC .................................. 439/70, 71, 140
See application file for complete search history.

(56) References Cited

U.S. PATENT DOCUMENTS

| | | | | |
|---|---|---|---|---|
| 4,887,969 A | * | 12/1989 | Abe ................................. | 439/73 |
| 5,015,946 A | * | 5/1991 | Janko ....................... | 324/750.25 |
| 5,106,309 A | * | 4/1992 | Matsuoka et al. .............. | 439/71 |
| 5,127,837 A | * | 7/1992 | Shah et al. ...................... | 439/71 |
| 5,312,263 A | * | 5/1994 | Zapalski et al. .............. | 439/181 |
| 5,329,227 A | * | 7/1994 | Sinclair ..................... | 324/756.02 |
| 5,500,605 A | * | 3/1996 | Chang ....................... | 324/754.14 |
| 5,534,787 A | * | 7/1996 | Levy ......................... | 324/754.09 |
| 5,562,473 A | * | 10/1996 | Ikeya et al. .................... | 439/331 |
| 5,599,194 A | * | 2/1997 | Ozawa et al. ................... | 439/72 |
| 5,766,022 A | * | 6/1998 | Chapin et al. ................... | 439/73 |
| 5,816,828 A | * | 10/1998 | Ikeya et al. ..................... | 439/73 |
| 6,220,870 B1 | * | 4/2001 | Barabi et al. .................... | 439/71 |
| 6,846,191 B2 | * | 1/2005 | Hobbs et al. ................... | 439/157 |
| 7,097,463 B2 | * | 8/2006 | Hsiao et al. ..................... | 439/70 |
| 7,278,858 B1 | * | 10/2007 | Trobough ....................... | 439/71 |
| 2003/0030458 A1 | * | 2/2003 | Van Hove et al. ............. | 324/758 |

* cited by examiner

*Primary Examiner* — Neil Abrams
*Assistant Examiner* — Phuongchi T Nguyen
(74) *Attorney, Agent, or Firm* — Altis & Wispro Law Group, Inc.

(57) ABSTRACT

A socket for a central processing unit (CPU) includes a housing, a bottom base, a slide base, and a number of resilient members. The bottom base is received in and fastened to a lower portion of the housing. The bottom base defines a number of accommodating holes which are slanted. A number of slanting pins extends up from a top of the bottom base. The slide base is slidably received in the housing and above the bottom base. The slide base defines a number of through holes, which are also slanted, for receiving the pins. The slide base includes a number of slanting protrusions for engaging in the accommodating holes. A receiving hole is defined in a bottom surface of each protrusion. Each resilient member is received in the receiving hole and accommodating hole.

11 Claims, 5 Drawing Sheets

CENTRAL PROCESSING UNIT SOCKET

BACKGROUND

1. Technical Field

The present disclosure relates to a central processing unit (CPU) socket.

2. Description of Related Art

The diameters of the contact points of a CPU are small, and the diameters of pins of a socket connecting the CPU to a motherboard must be small too. When the socket is idle, without being connected the CPU, the pins of the socket are broken easily if touched by something, such as fingers.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 1:
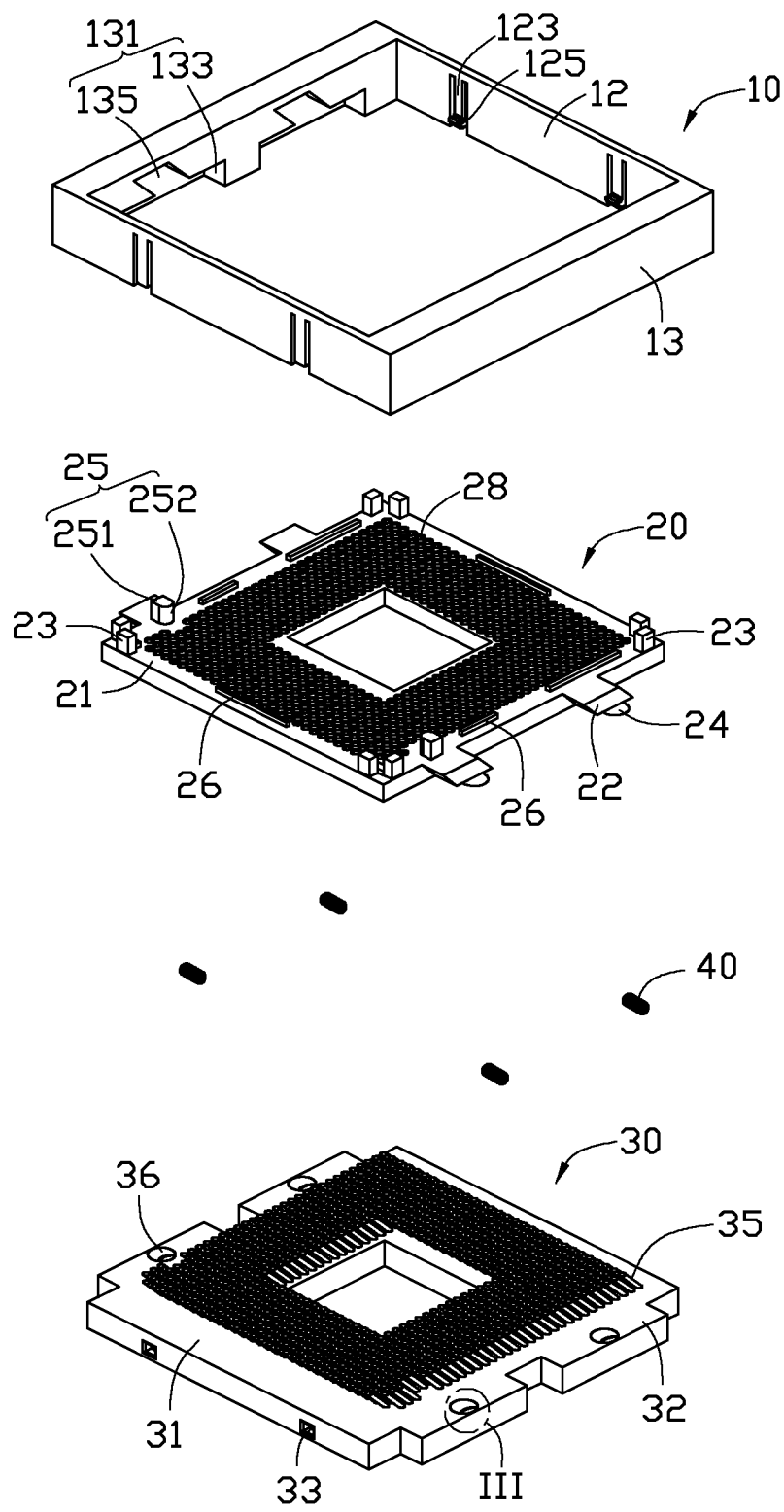
FIG. 1 is an exploded, isometric view of an exemplary embodiment of a central processing unit (CPU) socket.
Figure 4:
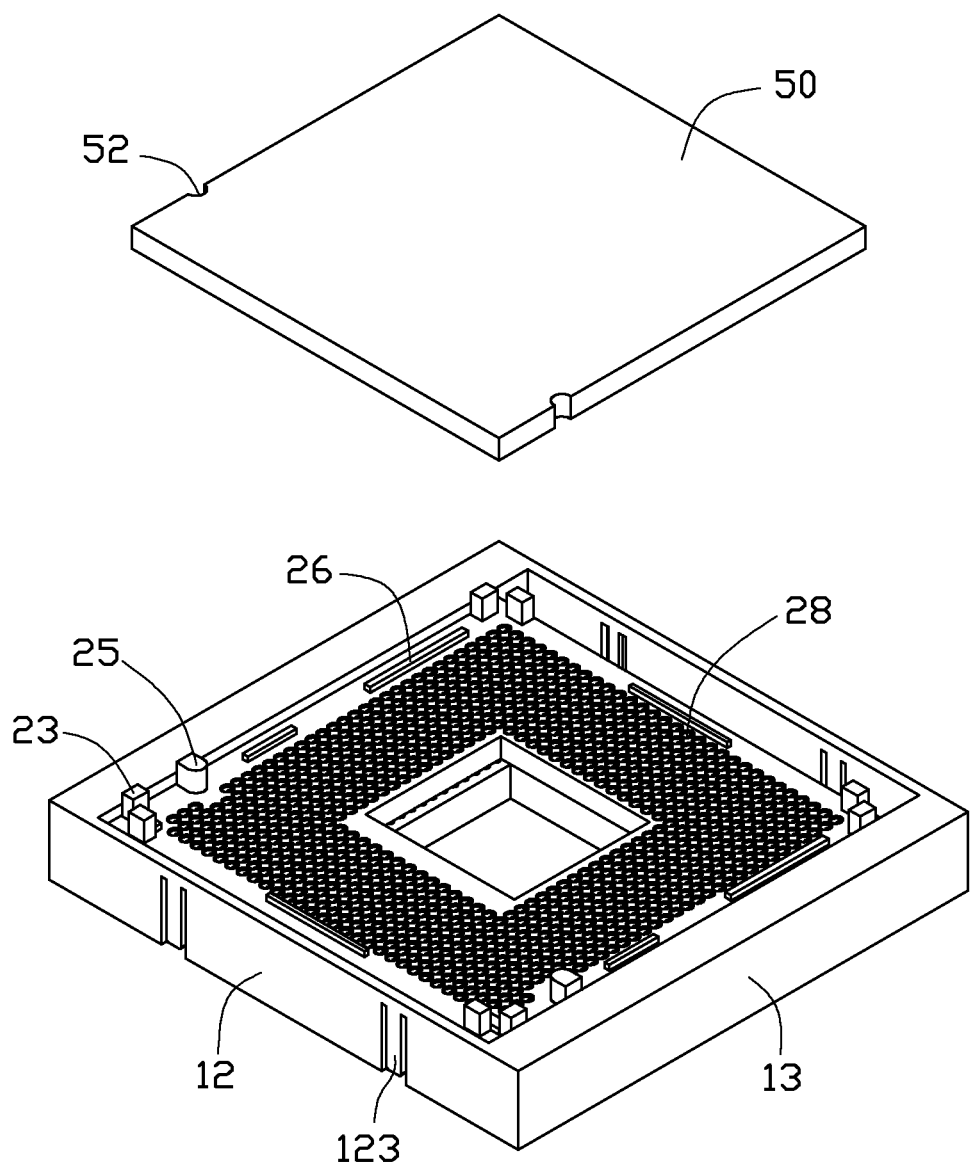
FIG. 4 is an assembled, isometric view of the socket of FIG. 1 together with a CPU.

FIGS. 1 and 4 show an exemplary embodiment of a socket provided for mounting a central processing unit (CPU) 50. The socket includes a housing 10, a slide base 20, a bottom base 30, and four resilient members 40. In the embodiment, the resilient members 40 are coil springs. Two semicircular cutouts 52 are defined in opposite sides of the CPU 50.

Figure 2:
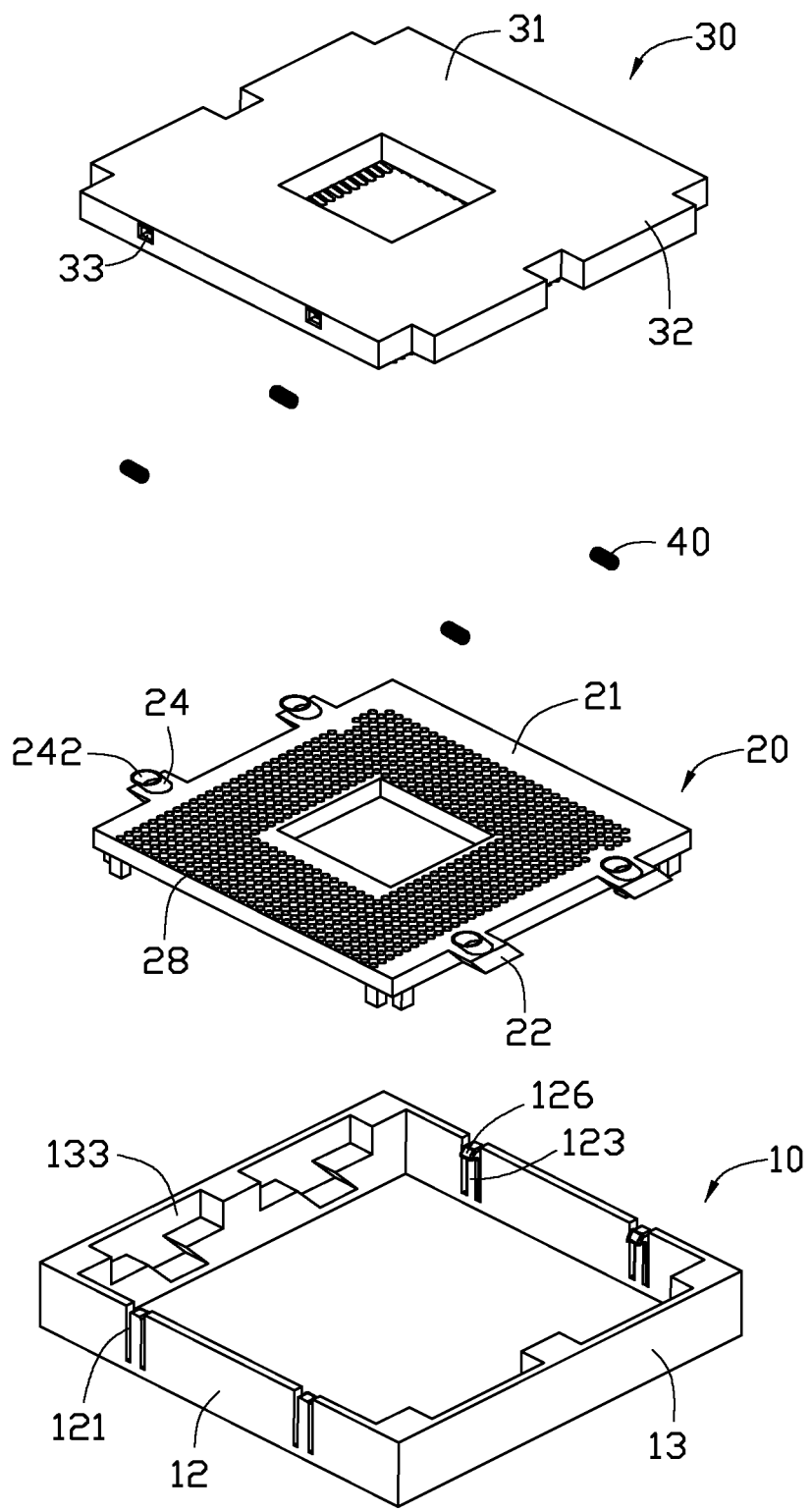
FIG. 2 is an inverted view of FIG. 1.

FIGS. 1 and 2 show the housing 10 which is a rectangular frame. The housing 10 includes two opposite first side plates 13 and two second side plates 12 respectively connected between front and rear ends of the first side plates 13. Two receiving slots 131 are defined in an inner side of each first side plate 13. Each receiving slot 131 includes a recess 133 extending through a bottom of the first side plate 13, and a slide slot 135 slantingly extending up from a middle of a top wall of the recess 133. Two openings 121 are defined in each second side plate 12, extending through a bottom of the second side plate 12. Two substantially L-shaped hooks 123 respectively extend down from the second side plate 12 bounding the tops of the openings 121. Each hook 123 includes a latch 125 formed on a distal end of the hook 123. A slanting guiding surface 126 is formed on each latch 125, facing the other second side plate 12.

The slide base 20 includes a rectangular main body 21 and four slanting slide blocks 22 extending from left and right sides of the main body 21. The slantingly extension direction of the slide blocks 22 is parallel to the extension direction of the slide slots 135. Two blocks 23 protrude from opposite ends of each side of a top surface of the main body 21. Two limitation blocks 25 respectively protrude from the left and right sides of the top surface of the main body 21. Each limitation block 25 includes a base block 251, and an abutting block 252 having a semicircular cross-section and extending from the base block 251 toward the other limitation block 25. A plurality of limitation bars 26 is formed on the sides of the top surface of the main body 21. A plurality of slanting through holes 28 is defined in the top surface of the main body 21, extending along a direction parallel to the extension direction of the slide blocks 22. A columnar protrusion 24 slantingly extends down from a bottom surface of each slide block 22, parallel to the extension direction of the through holes 28 and the slide block 22. A receiving hole 242 is axially defined in each protrusion 24, extending through a bottom end of the protrusion 24.

Figure 3:
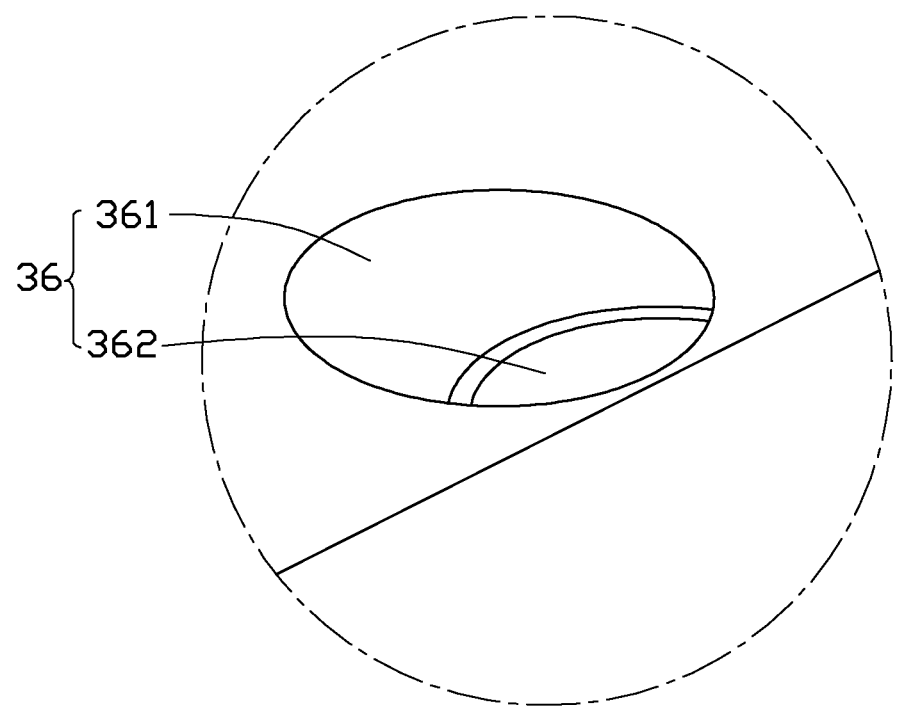
FIG. 3 is an enlarged view of a circled portion III of FIG. 1.

FIGS. 1 and 3 show the bottom base 30 including a rectangular base body 31 and four extension blocks 32 extending from left and right sides of the base body 31. Two hooking slots 33 are defined in each of front and rear sides of the base body 31. A plurality of slanting pins 35 is attached to a top of the base body 31. Two accommodating holes 36 are defined in each of the left and right sides of the base body 31. Each accommodating hole 36 includes a slanting first hole 361 defined in a top surface of each extension block 32 and extending along a direction parallel to the extension direction of the pins 35, and a slanting second hole 362 defined in a bottom surface of the extension block 32 and communicating with the first hole 361. The diameter of the second hole 362 is less than that of the first hole 361, and is coaxial with the first hole 361.

In the embodiment, the angle between the pins 35 and the top surface of the base body 31 is about 45 degrees.

Figure 5:
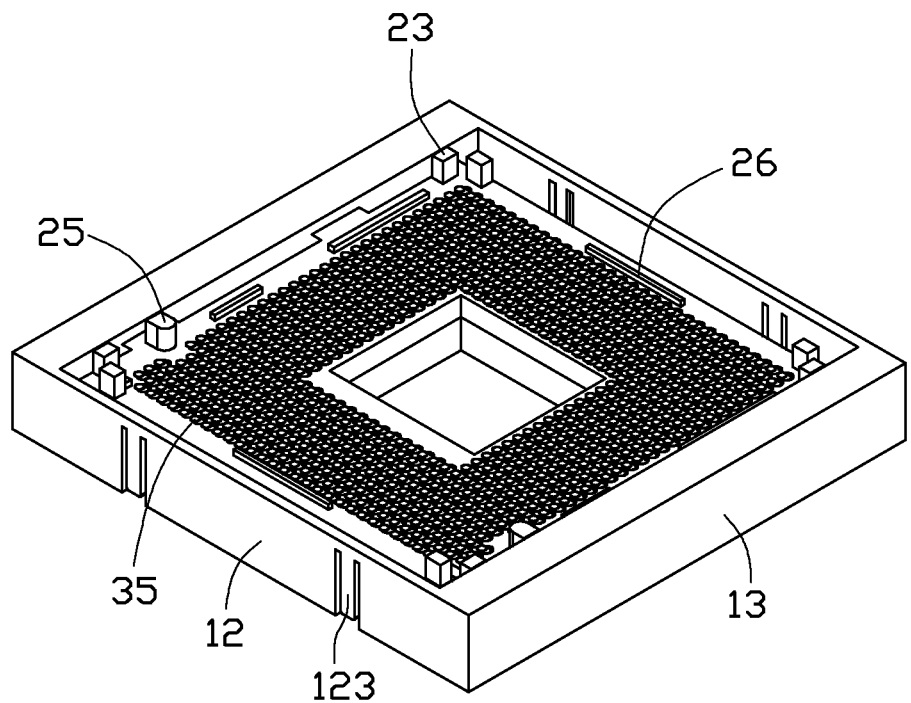
FIG. 5 is similar to FIG. 4, but omitting the CPU and showing another state of the socket.

FIGS. 4 and 5 show the assembly, that the slide base 20 is placed below the housing 10 and then manipulated up, to allow the slide blocks 22 to be received in the corresponding slide slots 135. Certain distances exist between the slide base 20 and the second side plates 12. First ends of the resilient members 40 are placed in the corresponding accommodating holes 36. The bottom base 30 is placed below the housing 10 and manipulated up, to allow the extension blocks 32 to be received in the corresponding recesses 133. The latches 125 engage in the corresponding hooking slots 33, guided by the guiding surfaces 126. The protrusions 24 engage in the corresponding first holes 361, to allow second ends of the resilient members 40 to be received in the corresponding receiving holes 242. The resilient members 40 respectively abut against top walls of the receiving holes 242 and bottom walls of the second holes 362, to create space between the slide base 20 and the bottom base 30. The slide blocks 22 abut against top walls of the corresponding slide slots 135. Upper portions of the pins 35 are received in the corresponding through holes 28, so the pins 35 are protected when the socket is idle without connecting the CPU 50.

To connect the CPU 50, the CPU 50 is manipulated down toward the slide base 20, until the CPU 50 abuts against the limitation bars 26. The blocks 23 abut against the corresponding side surfaces of the CPU 50. The abutting blocks 252 engage in the corresponding cutouts 52. The CPU 50 continues to be manipulated down, the slide blocks 22 slide down along the corresponding slide slots 135, until the protrusions 24 abut against the bottom walls of the corresponding first holes 361. The resilient members 40 are thus compressed. The pins 35 extend out of the corresponding through holes 28 to be electrically connected to the CPU 50. The height of the limitation bars 26 is nearly the same as the height of the pins 35 extending out of the through holes 28, so that the pins 35 are subjected to relatively low pressure by the CPU 50, which will further prolong the life of the pins 35.

Even though numerous characteristics and advantages of the embodiments have been set forth in the foregoing description, together with details of the structure and the functions of the embodiments, the disclosure is illustrative only, and changes may be made in details, especially in the matters of shape, size, and arrangement of parts within the principles of the embodiments to the full extent indicated by the broad general meaning of the terms in which the appended claims are expressed.

What is claimed is:

1. A socket for a central processing unit (CPU), comprising:
    a housing;
    a bottom base received in and fastened to a lower portion of the housing, the bottom base defining a plurality of slanting accommodating holes, a plurality of slanting pins extending up from a top of the bottom base, wherein a slanting direction of the accommodating holes is the same as a slanting direction of the pins;
    a slide base slidably received in the housing and above the bottom base, the slide base defining a plurality of slanting through holes receiving the pins, the slide base comprising a plurality of slanting protrusions respectively engaged in the accommodating holes, each protrusion defining a slanting receiving hole; and
    a plurality of resilient members each received in one of the receiving hole and the corresponding accommodating hole;
    wherein when the slide base slides down, the protrusions slide down along the corresponding accommodating holes and compress the resilient members, the pins extend out of the corresponding through holes from a top of the slide base, to connect the CPU.

2. The socket of claim 1, wherein the housing comprises two opposite first side plates, two receiving slots are defined in an inner side of each first side plate, each receiving slot comprises a recess extending through a bottom of the first side plate and a slide slot slantingly extending up from a top wall of the recess, the slide base comprises a main body and four slanting slide blocks extending from the main body to be respectively slidably received in the slide slots, the bottom base comprises a base body and four extension blocks extending from the base body to be respectively received in the recesses.

3. The socket of claim 2, wherein a plurality of limitation bars is formed on sides of the top surface of the main body to abut against a bottom surface of the CPU.

4. The socket of claim 3, wherein the height of the limitation bars is nearly the same as the height of the pins extending out of the through holes.

5. The socket of claim 3, wherein the main body is rectangular, two blocks protrude from opposite ends of each side of the top surface of the main body, to abut against side surfaces of the CPU.

6. The socket of claim 3, wherein two limitation blocks protrude from the top surface of the main body to engage in two cutouts respectively defined in opposite sides of the CPU.

7. The socket of claim 2, wherein the protrusions extend down from bottoms of the corresponding slide blocks, the accommodating holes are respectively defined in the extension blocks.

8. The socket of claim 7, wherein each accommodating hole comprises a first hole defined in the corresponding extension block, and a second hole defined in a bottom wall of the first hole, the diameter of the second hole is less than the first hole, the protrusions are operable to abut against the bottom walls of the corresponding first holes, each resilient member abuts against a top wall of the corresponding receiving hole and a bottom wall of the corresponding second hole.

9. The socket of claim 2, wherein the housing further comprises two second side plates connected between corresponding ends of the first side plates, the base body is fastened to the second side plates.

10. The socket of claim 9, wherein four hooking slots are defined in sides of the base body facing the second side plates, four latches are formed on the second side plates to engage in the corresponding hooking slots.

11. The socket of claim 10, wherein each second side plate defines two openings, two substantially L-shaped hooks extend down from the second side plate bounding tops of the openings, the latches are in distal ends of the corresponding hooks.

* * * * *